United States Patent [19]

Shrivastava et al.

[11] Patent Number: 5,557,122

[45] Date of Patent: Sep. 17, 1996

[54] SEMICONDUCTOR ELECTRODE HAVING IMPROVED GRAIN STRUCTURE AND OXIDE GROWTH PROPERTIES

[75] Inventors: Ritu Shrivastava, Fremont; Chitranjan N. Reddy, Milpitas, both of Calif.

[73] Assignee: Alliance Semiconductors Corporation, San Jose, Calif.

[21] Appl. No.: 438,956

[22] Filed: May 12, 1995

[51] Int. Cl.$^6$ .................... H01L 27/108; H01L 29/788
[52] U.S. Cl. .................... 257/309; 257/315; 257/316; 257/321; 257/324
[58] Field of Search .................... 257/57, 309, 310, 257/315, 316, 317, 532, 534, 321, 324, 325, 326, 410, 411, 406; 365/185; 361/305

[56] References Cited

U.S. PATENT DOCUMENTS

| 4,786,954 | 11/1988 | Morie et al. | 257/304 |
| 5,289,026 | 2/1994 | Ong | 257/315 |

OTHER PUBLICATIONS

Aritome et al., "Reliability Issues of Flash Memory Cells", *Proceedings of the IEEE*, vol. 81, No. 5, May 1993, pp. 779–781.

Kobayashi et al., "Nitrogen in–situ doped Poly Buffer LOCOS: Simple and Scalable Isolation Technology for Deep–Submicron Silicon Devices", *IEEE Technical Digest IEDM*, 1994, pp. 683–686.

Muramatsu et al, "The Solution of Over–Erase Problem Controlling Poly–Si Grain Size—Modified Scaling Principles for FLASH Memory", *IEEE Technical Digest IEDM*, 1994, pp. 847–850.

*Primary Examiner*—Minhloan Tran
*Attorney, Agent, or Firm*—Bradley T. Sako

[57] ABSTRACT

The use of nitrogen doped amorphous silicon as an electrode material for a semiconductor integrated circuit is described. A preferred embodiment is a single transistor flash EPROM cell is disclosed having a tunnel dielectric (202), a floating gate (206), an intergate dielectric having three layers (208, 210, 212), and a control gate (218). The floating gate (206) is composed of in-situ nitrogen doped amorphous silicon. Due to the nitrogen doping the floating gate (206) retains its microcrystalline structure under high temperatures, eliminating large grain boundaries in the floating gate (206). As a result, arrays composed of the disclosed EPROM cell have improved memory cell threshold ($V_{TM}$) distributions. In addition, silicon oxide grown from the the floating gate (206) has fewer stress induced defects reducing leakage paths that contribute to data retention errors.

An alternate embodiment uses nitrogen doped amorphous silicon as the capacitor plates (304 and 306) in a DRAM cell (300). The nitrogen doped amorphous silicon oxidizes at a slower rate than undoped amorphous silicon and has less inherent stress resulting in thinner a capacitor dielectric (308) of fewer defects. The capacitor plates (304 and 306) maintain their microcrystalline structure throughout subsequent temperature cycling resulting in increased capacitor area.

13 Claims, 5 Drawing Sheets 5,557,122

SEMICONDUCTOR ELECTRODE HAVING IMPROVED GRAIN STRUCTURE AND OXIDE GROWTH PROPERTIES

TECHNICAL FIELD

The present invention relates generally to integrated circuits, and more particularly to electrodes fabricated from thin films semiconductor layers.

BACKGROUND OF THE INVENTION

Semiconductor materials, such as patterned polysilicon, are commonly used as electrodes in integrated circuits. Among the many types of structures categorized as "electrodes" are transistor gates and capacitor plates. It is well known in the art to deposit and pattern a layer of polysilicon and then oxidize the resulting polysilicon structures to grow a layer of silicon dioxide. The quality and thickness of silicon dioxide grown on polysilicon can play an important role in the reliability and performance of an integrated circuit device. Two particular types of devices where this type of silicon dioxide plays a critical role are dynamic random access memory (DRAM) cells and nonvolatile memory devices employing "floating" gates.

Among the types of nonvolatile memory devices are erasable programmable read only memories (EPROMs). Within the group of EPROMs are "flash" EPROMs and "conventional" EPROMs (referred to herein as EEPROMs). Unlike EEPROMs which use Fowler-Nordheim tunneling for programming and erasing a floating gate, flash EPROMs use hot-electron injection to program and Fowler-Nordheim tunneling for erase.

While many different types of flash EPROM cells exist in the prior art, the single transistor flash EPROM cell (1-T cell) has become more prevalent due to its greater packing density. A prior art 1-T cell is set forth in FIG. 1 and designated by the general reference character 10. The 1-T cell 10 includes a substrate 12 having a channel 14, a source diffusion 16, and a drain diffusion 18. A tunnel oxide 20 separates the substrate 12 from a gate stack 22. The gate stack 22 is composed of a floating gate 24 an intergate dielectric 26, and a control gate 28.

During programming, the source 16 is grounded, and a positive voltage is applied to the control gate 28 with respect to the drain 18. Electrons are injected into the floating gate resulting in an overall higher memory cell threshold voltage ($V_{TM}$). During erase, a positive voltage is applied to the source 16 with respect to the control gate 28, and electrons tunnel from the floating gate 24 to the source 16.

The fabrication of 1-T cells begins with the growth or deposition of the tunnel oxide 20. A layer of polysilicon is deposited over the tunnel oxide 20 to form a floating gate layer. The conductivity of the floating gate layer can be increased by in-situ doping or ion implantation. The interpoly dielectric 26 is then created on top of the floating gate 24. As shown in FIG. 1, the interpoly dielectric 26 is typically a three layer dielectric of silicon dioxide, silicon nitride, and silicon dioxide. It is common to form the first layer by oxidizing the polysilicon floating gate layer. A control gate layer is formed by depositing a second layer of polysilicon over the interpoly dielectric, and doping it, if required. The three layers (floating gate, interpoly dielectric, and control gate) are then patterned to create a number of gate stacks 22. The polycrystalline structure of the polysilicon gates (24 and 28) are shown in exaggerated form in FIG. 1. The gate stack 22 is subject to a subsequent oxidation step to form oxide sidewalls. The remainder of the fabrication process continues using well know steps (the so called "back-end" of the process). The back-end can include a number of additional temperature cycles.

Despite the advantages of flash EPROM technology, a number of reliability issues exist in the prior art. In flash EPROM memory designs a number of cells share a common source node allowing for the simultaneous (flash) erase of the entire memory array or a portion thereof (also referred to as a "sector" or a "block"). One problem raised by this erase function is that of "over-erase". In the event a cell possesses an erase (tunneling) current greater than the other cells in the array (or sector), during a given erase operation the cell having the higher erase current will be over-erased while the other cells are properly erased. Over-erase results in unacceptably low $V_{TM}$ and can result in the cell functioning as a depletion mode device. An aspect of the over-erase mechanism for floating gates of polysilicon construction is discussed in IEEE Technical Digest IEDM 1994, pp. 847–850 in an article entitled "The Solution of Over-Erase Problem Controlling Poly-Si Grain Size—Modified Scaling Principles for FLASH Memory" by Muramatsu et al. The article demonstrates how "oxide valleys" can occur at grain boundaries, and as a result, larger grain floating gates present larger distributions in $V_{TM}$.

A number of methods addressing the over-erase problem are set forth in Proceedings of the IEEE, Vol. 81, No. 5, May 1993 in an article entitled "Reliability Issued of Flash Memory Cells" by Aritome et al. The methods set forth in Aritome et al. have drawbacks however. The use of a series enhancement transistor adds to process complexity, and increases overall cell size. The various verify-erase methods can require additional circuits and can increase erase time substantially.

A second reliability issue discussed in Aritome et al. is that of data retention. After a cell has been programmed, various mechanisms, including oxide defects can lead to the electrons leaking from the floating gate. Leakage paths can occur through the interpoly dielectric to the control gate, or through the tunnel oxide to the substrate as well. Data retention failures cause low $V_{TM}$ in programmed cells. A severe enough data retention problem results in programmed cells having $V_{Tm}$s that approach those of erased cells.

Commonly-owned, U.S. Pat. No. 5,416,738 entitled SINGLE TRANSISTOR FLASH EPROM CELL AND METHOD OF OPERATION, incorporated by reference herein, discloses a flash EPROM arrangement wherein a negative voltage is applied to non-selected cells during read operations to tolerate a wider range of erased (and even over-erased) cell $V_{TM}$s.

While the interpoly dielectric of flash EPROM cells can play an important role in the reliability of the flash devices, a similar structure also plays an important part in DRAM cells. It is known in the prior art to fabricate DRAM cells having a cell capacitor formed by a sandwich layer of a first layer of polysilicon, a capacitor dielectric and a second layer of polysilicon. To increase the sensed DRAM cell signal, various methods have been introduced to increase the capacitance of the cell capacitor. Such approaches have addressed three variables of cell design; increasing capacitor area, using dielectrics having higher dielectric constants, and reducing the dielectric thickness. For example, it is known to increase capacitor area by depositing a "textured" layers of polysilicon. To increase dielectric permittivity it is known to use higher dielectic constant materials such as oxy-nitride or tantalum oxide. Reducing the dielectric thickness requires attention to properties such as the polysilicon interface and grain size which change as a function of growth and back-end temperature cycles. The grain structure affects the quality of the dielectric (such as its leakage properties, as described above).

In a field unrelated to floating gate technology, an improved local oxidation of silicon (LOCOS) technique is presented that utilizes nitrogen-doped amorphous silicon to reduce the stress and formation of voids during LOCOS in IEEE Technical Digest IEDM 1994, pp. 683–686 in an article entitled "Nitrogen in-situ doped Poly Buffered LOCOS: Simple and Scalable Isolation Technology for Deep Submicron Silicon Devices" by Kobayashi et al.

While those references directed to flash EPROMs provide many solutions to the over-erase problem, arrays of 1-T flash cells continue to be manufactured with $V_{TM}$ distributions that are either too wide to compensate for with the prior art methods, or, if correctable by prior art methods, would introduce additional process complexity or an unacceptable amount of additional circuitry. It is therefore desirable to provide an EPROM cell design that results in tighter $V_{TM}$ distributions without increasing process complexity. Further, it is always desirable to provide a DRAM cell with a capacitor having increased capacitance and a dielectric of increased reliability.

SUMMARY OF THE INVENTION

It is an object of the present invention to provide a floating gate for a single transistor flash EPROM cell that reduces $V_{TM}$ distributions.

It is another object of the invention to provide a method of fabricating a floating gate for flash EPROM cells that reduces the over-erase problem.

It is another object of the present invention to provide a capacitor electrode for a DRAM cell capacitor that provides increased capacitance.

It is another object of the present invention to provide a capacitor electrode for a DRAM cell capacitor that provides improved dielectric quality.

According to a first embodiment of the present invention an array of single transistor flash EPROM cells is fabricated with each cell having a stacked gate structure that includes a floating gate, an intergate dielectric, and a control gate. The floating gate is composed of nitrogen in-situ doped amorphous silicon. The amorphous structure of the floating gate eliminates the presence of relatively large grain boundaries that result in wide $V_{TM}$ distributions.

According an aspect of the invention, the amorphous silicon is doped resulting in a more uniform and dense distribution of "oxide valleys", and correspondingly, a more uniform distribution of $V_{TM}$s over the array of cells.

According to another aspect of the present invention the intergate dielectric includes a layer of silicon dioxide formed by oxidizing the floating gate resulting in an intergate dielectric having less inherent stress, and as a result, fewer oxide defects.

According to an alternate embodiment of the present invention a DRAM cell is fabricated with cell capacitor electrodes composed of nitrogen in-situ doped amorphous silicon. The oxidation and back-end temperature cycles of the nitrogen in-situ doped amorphous silicon results in a lower oxidation rate and low stress thermally grown silicon dioxide. Thus a DRAM cell fabricated with the improved microcrystalline structure of the amorphous silicon can have increased cell capacitance in addition to a higher quality silicon dioxides around the capacitor electrodes.

Other objects and advantages of the invention will become apparent in light of the following description thereof.

BRIEF DESCRIPTION OF THE DRAWINGS

FIGS. 3a, 3b, 3h and 3I are taken along the length of the transistor. FIGS. 3c–3g are taken along the width direction of the transistor.

DETAILED DESCRIPTION OF THE EMBODIMENTS

The preferred embodiment of the present invention is an in-situ nitrogen doped amorphous silicon ($\alpha$-Si) electrode employed as a floating gate in a single transistor flash EPROM cell. The preferred embodiment sets forth the single transistor cell and a method of manufacturing thereof.

Figure 2:
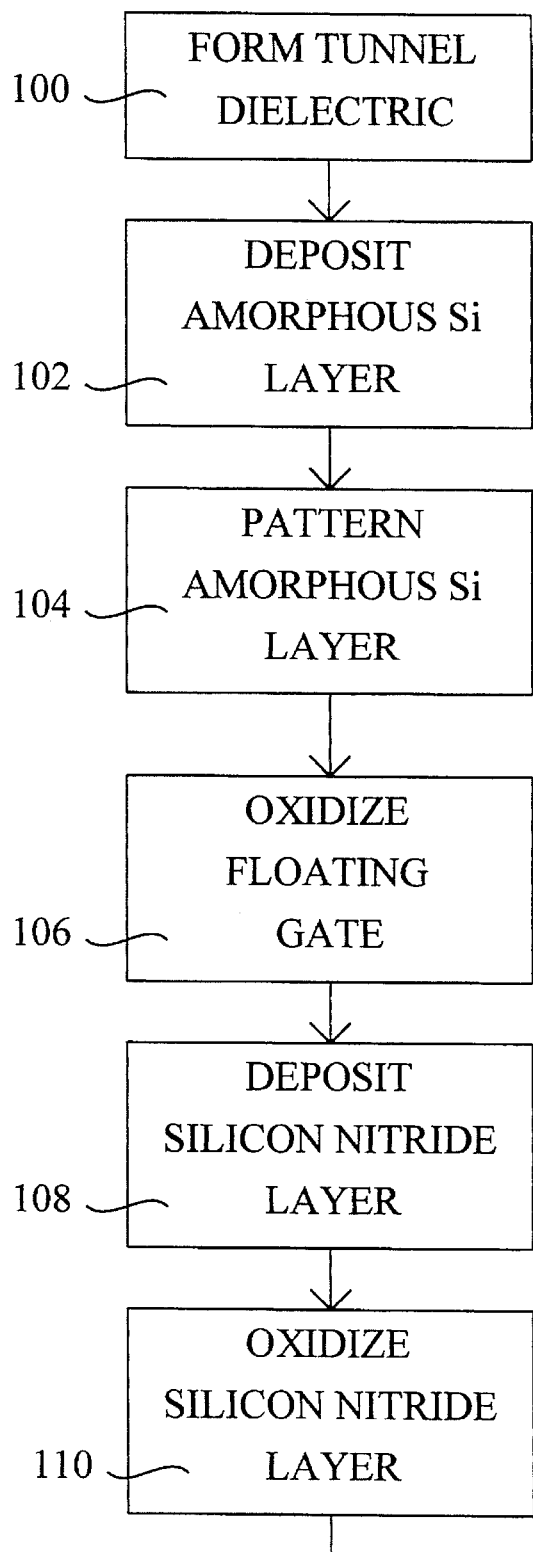
FIG. 2 is a block diagram illustrating a method of manufacturing a single transistor flash EPROM cell according to the present invention.
Figure 2:
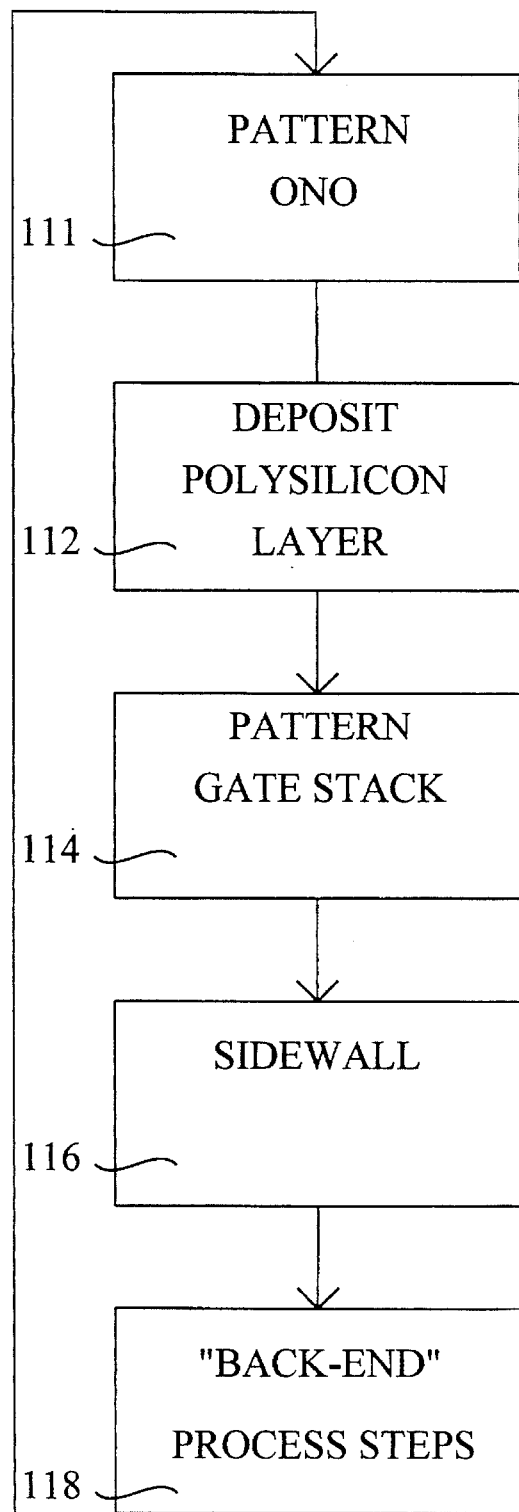

FIG. 2 sets forth, in a general block diagram, the various steps for fabricating a flash EPROM cell according to a preferred embodiment of the present invention. A tunnel oxide is formed on the surface of a p-type silicon substrate (step 100). A layer of nitrogen doped $\alpha$-Si is deposited over the tunnel oxide (step 102) and patterned to create a floating gate (step 104). The use of nitrogen doped $\alpha$-Si provides a number of advantages over the prior art, as will be discussed at a later point herein. The floating gate is oxidized to form a first layer of silicon oxide around the $\alpha$-Si floating gate (step 106). A layer of silicon nitride is deposited over the first layer of silicon oxide (step 108) and subsequently oxidized to create a second layer of silicon oxide (step 110). Steps 106, 108 and 110 produce a three layer dielectric of silicon dioxide, silicon nitride, and silicon oxide (also referred to as "ONO"). The ONO is patterned to provide protection to the sides of the $\alpha$-Si gate (step 111). A layer of polycrystalline silicon (polysilicon) is then deposited over the patterned ONO (step 112).

A gate stack is formed according to the present invention using conventional techniques. Referring once again to FIG. 2, it is shown that a gate stack etch mask is formed on the polysilicon and a gate stack formed by a pattern gate stack step (step 114). The gate stack is oxidized in a sidewall formation step (step 116) and the process concludes with conventional process techniques (step 118).

Figure 1:
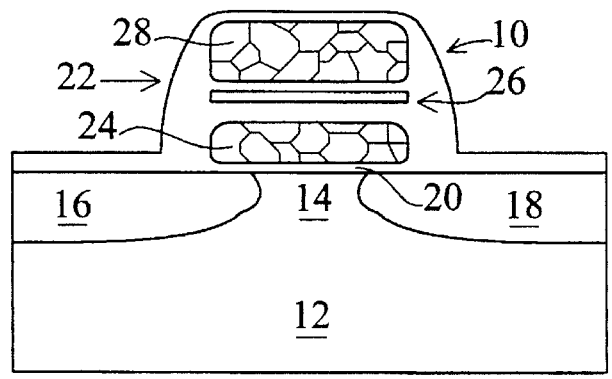
FIG. 1 is a side cross sectional view illustrating the structure of a single transistor flash EPROM cell according to the prior art.
Figure 3A:
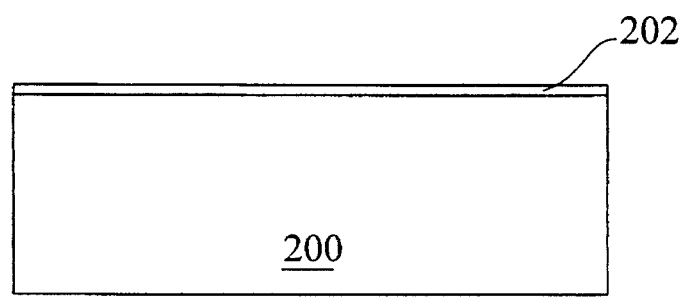
FIGS. 3a–3i are side cross sectional views illustrating a method of manufacturing a single transistor flash EPROM cell according to the present invention.

Referring now to FIGS. 3a–3i a number of cross sectional views are set forth illustrating a single transistor flash EPROM cell fabricated according to the present invention. FIG. 3a is a side cross sectional view taken along the channel "length" direction of the cell to be produced. The figure illustrates the EPROM cell following the completion of step 100 and includes a substrate 200 with the tunnel oxide 202 formed thereon. In the preferred embodiment the substrate is P-type silicon and the tunnel oxide 202 is formed by thermally growing a thin layer of silicon dioxide on the substrate. While the preferred embodiment sets forth silicon dioxide as the tunnel oxide material, this should not be construed as limiting the invention to a particular type of tunnel oxide.

Figure 3B:
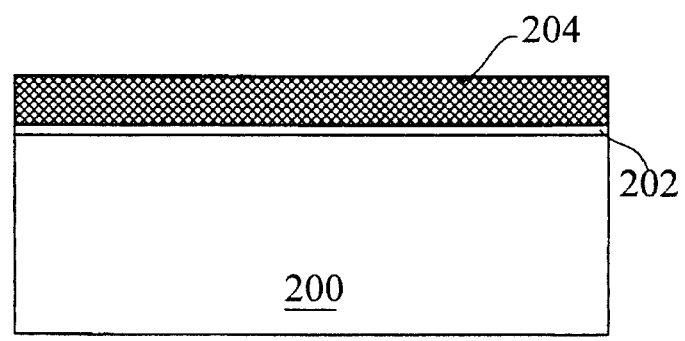

FIG. 3b illustrates the EPROM cell following step 102 of FIG. 2, and like FIG. 3a is a cross sectional view along the channel length direction. A layer of amorphous silicon (α-Si) 204 is deposited over the tunnel dielectric 202. The α-Si 204 has a thickness of approximately 1000Å and, as is well known in the art, is micro-crystalline in structure. The α-Si 204 is nitrogen doped by an in-situ, low pressure chemical vapor deposition (LPCVD) process using disilane ($Si_2H_6$) and ammonia ($NH_3$) gases. In the preferred embodiment the conductivity of the α-Si 204 is adjusted by an ion implantation of an "n" or "p" type impurity.

Figure 3C:
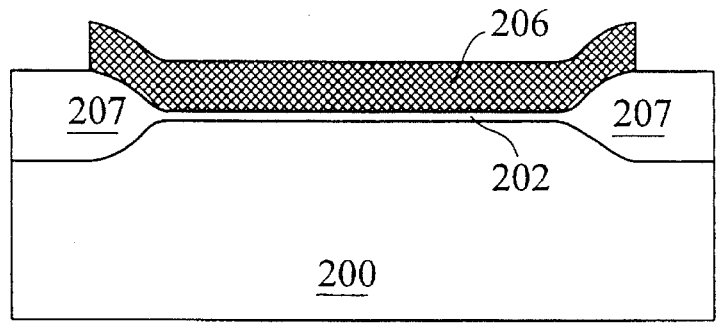

FIG. 3c represents the EPROM cell following step 104. The α-Si 204 has been patterned to create a floating gate 206. Unlike FIGS. 3a and 3b, FIG. 3c is a cross sectional view along the "width" direction of the cell which is perpendicular to the length direction. Accordingly, FIG. 3c illustrates field oxide 207 created by a local oxidation of silicon (LOCOS) process. The LOCOS of the preferred embodiment is conventional and so will not be discussed in detail herein. Conventional photolithographic techniques are used to create an etch mask for the α-Si 204 and anisotropic etching is used to pattern the α-Si 204 into the floating gate 206. In the preferred embodiment reactive ion etching (RIE) is used to etch the exposed portions of the α-Si down to the tunnel oxide layer 202. RIE etch methods selective to α-Si with respect to silicon dioxide are well known in the art and so will not be discussed in detail herein.

Figure 3D:
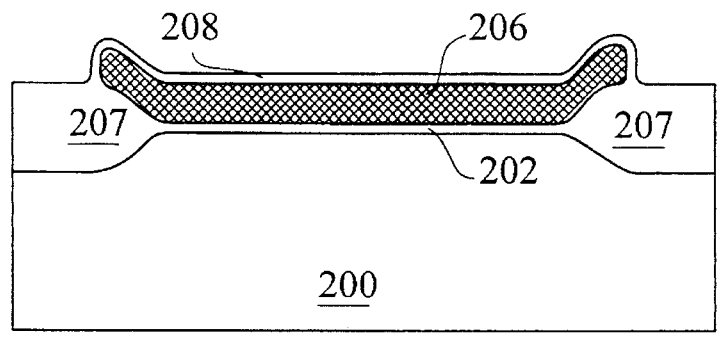

FIG. 3d illustrates step 106 of the process. FIG. 3d is a side cross sectional view along the width direction of the EPROM cell. Following the formation of a floating gate 206, the first layer of a triple layer intergate dielectric is formed by oxidizing the α-Si floating gate 206 to create a first intergate dielectric layer 208 of silicon dioxide. In the preferred embodiment the oxidation employs ambient steam and the thickness of the first intergate dielectric is approximately 100Å. It is noted that the nitrogen doped α-Si provides advantages over floating gates of the prior art in that the floating gate 206 of the present invention retains its micro-crystalline structure throughout the oxidation step (step 106) resulting in a smooth, low stress edge morphology on the floating gate 206. The reduction in stress reduces the chances of oxide defects from forming which are known to contribute to data retention errors.

Figure 3E:
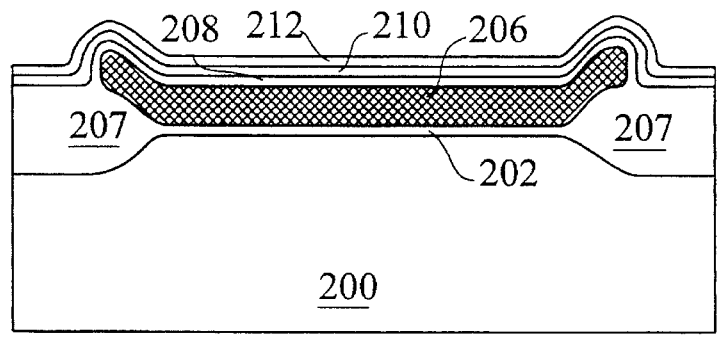

Following the oxidation of the floating gate 206, the remainder of the intergate dielectric is formed by steps 108 and 110 of FIG. 2. Referring now to FIG. 3e taken along the width direction of the cell, it is shown that a thin layer of silicon nitride is deposited over the cell. The silicon nitride is the second dielectric layer 210. In the preferred embodiment, chemical vapor deposition is used to cream a silicon nitride layer of approximately 100Å. FIG. 3e also shows the EPROM cell following step 110. The silicon nitride is oxidized to create a layer of silicon dioxide which forms the third intergate dielectric layer 212. In the preferred embodiment the resulting thickness of the third intergate dielectric is in the range of 30Å. The result is an ONO layer over the floating gate 206.

Figure 3F:
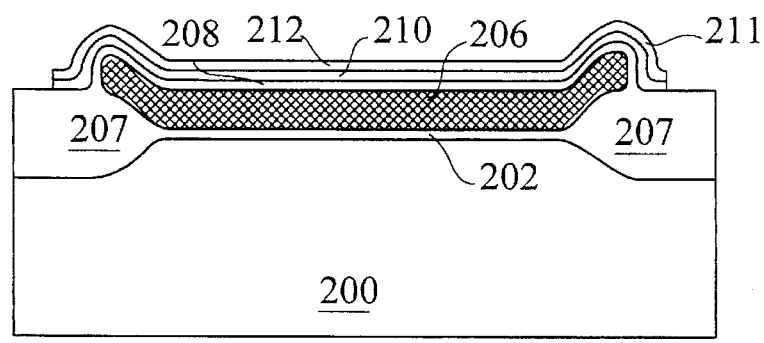

FIG. 3f is a side cross sectional view taken along the width direction of the EPROM cell following step 111. The ONO is patterned and etched to provide an ONO pattern 211 that protects the sides of the floating gate 206.

Figure 3G:
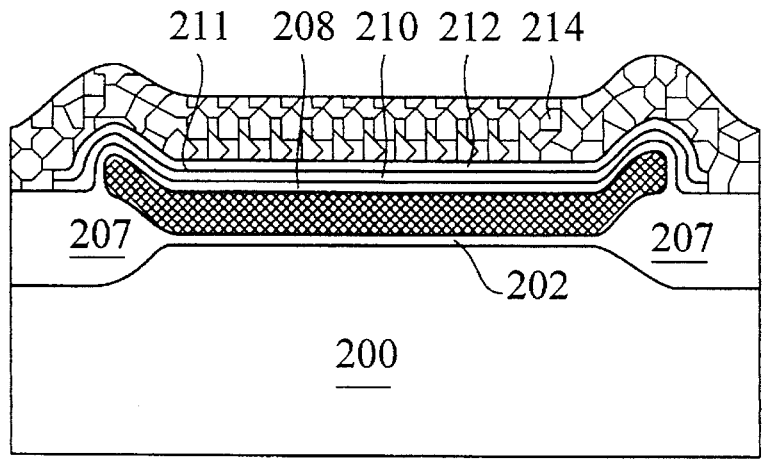

A polysilicon layer 214 is deposited over the ONO pattern 211 in step 112. FIG. 3g, taken along the width direction of the cell, illustrates the polysilicon layer 214 following deposition. The polycrystalline structure is fancifully illustrated to distinguish it from the micro-crystalline structure of the floating gate 206. In the preferred embodiment the polysilicon is doped to increase conductivity and includes a top layer of silicide. The deposition of the polysilicon and the formation of the silicide are well known in the art and so will not be discussed any further detail herein.

Figure 3H:
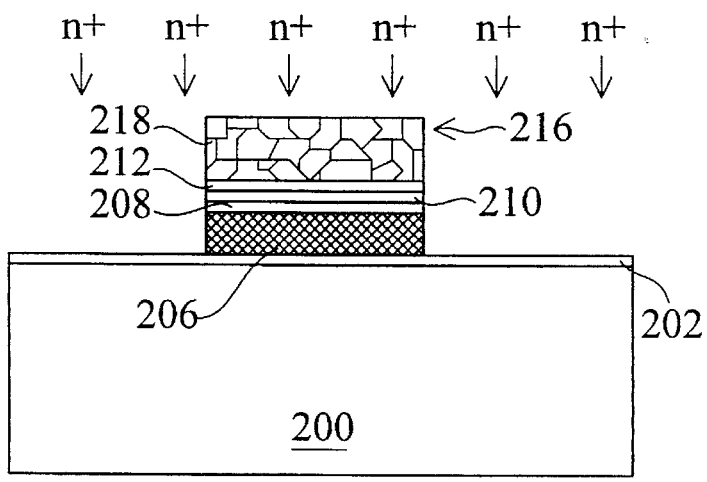

The entire structure set forth in FIG. 3g is patterned by a pattern gate stack step (step 114). The EPROM cell following this step is illustrated in FIG. 3h. Unlike FIGS. 3c–3g, FIG. 3h is taken along the length direction of the cell. Using conventional photolithographic techniques, an etch mask for a gate stack is formed and an anisotropic etch applied. The unmasked areas are etched down to the tunnel dielectric 202. The etch mask is stripped leaving a gate stack 216, as is shown in FIG. 3h. The gate stack 216 includes a control gate 218 patterned from the polysilicon layer 214, and the three intergate dielectric layers (208, 210 and 212) intermediate the floating gate 206. FIG. 3h also fancifully illustrates a source-drain implant step wherein an n+source and drain are created. As is well understood in 1-T EPROM cell configurations, during erase operations, a diffusion region receives electrons from the floating gate via tunneling. Accordingly, in the preferred embodiment, the erase electrode is the source diffusion.

Figure 3I:
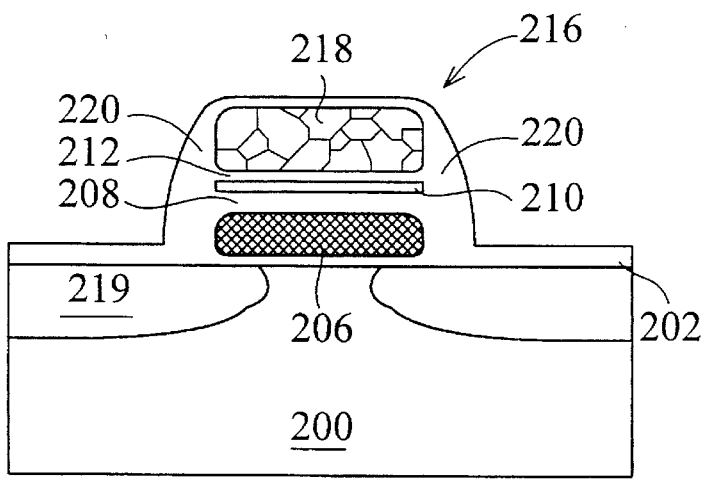

The formation of gate stack sidewalls 220 and the subsequent "back end" process of steps 116 and 118 of FIG. 2 are represented by FIG. 3i, taken along the length direction. As shown in FIG. 3i, the gate stack 216 is subject to additional oxidation steps to form the sidewalls 220. The in-situ nitrogen doping of the floating gate 206 provides further advantages for the EPROM cell of the present invention. Due to the nitrogen doping, the α-Si maintains a microcrystalline structure throughout the "back end" (steps 116 and 118) of the fabrication process. As a result, the side wall oxidation of the floating gate 206 produces a lower stress oxide. This reduces the occurrence of sidewall oxide defects which create data retention errors due to charge leakage through the defects. Further, the nitrogen doped α-Si can undergo a larger number of back-end temperature cycles and/or higher back-end process temperatures than conventional α-Si before adversely large crystalline grain structures (and consequently oxide valleys) are created. Accordingly, the present invention provides more back-end temperature flexibility in addition to better $V_{TM}$ distributions.

Figure 4:
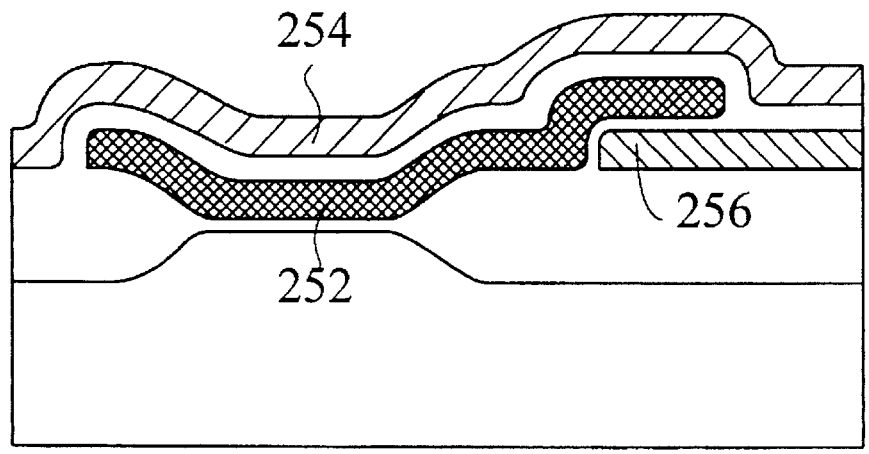
FIG. 4 is a side cross sectional view of three gate EPROM cell according to an alternate embodiment of the present invention.

While the preferred embodiment sets forth a single transistor flash EPROM cell and method of manufacturing thereof, it is understood that the invention is applicable to any device utilizing Fowler-Nordheim tunneling to transfer electrons from a floating gate through a runnel dielectric. Just a few examples would be flash EPROM cells of "step" gate or three gate design, or even "conventional"EEPROMs. An alternate embodiment employing the three gate design is set forth in FIG. 4. The embodiment is designated by the general reference character 250 and includes a floating gate 252 formed from nitrogen doped amorphous silicon, a control gate 254, and an erase gate 256. The operation of the three gate alternate embodiment is conventional in nature.

Figure 5:
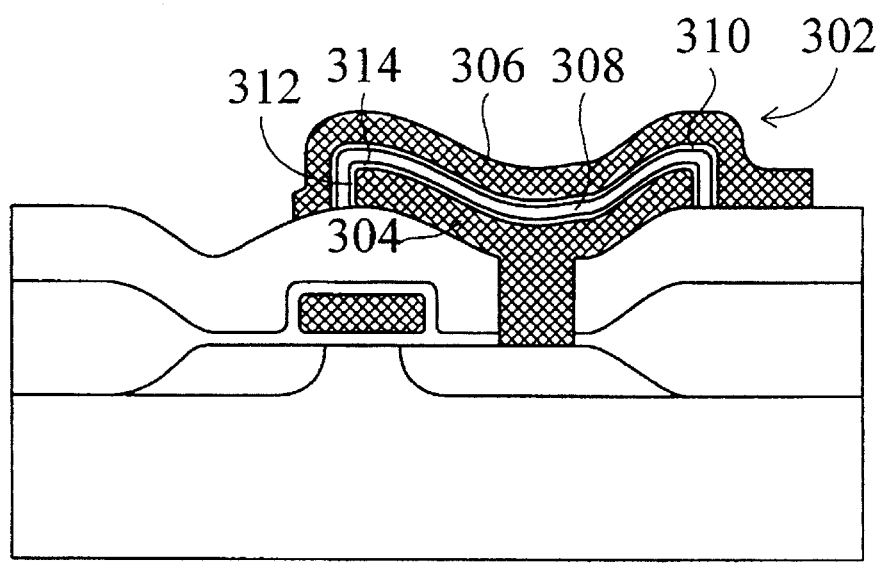
FIG. 5 is a side cross sectional view of DRAM cell according to an alternate embodiment of the present invention.

An alternate embodiment of the present invention is illustrated in FIG. 5. The alternate embodiment employs two in-sire nitrogen doped amorphous silicon electrodes as a first and second capacitor plate in single transistor DRAM cell capacitor. FIG. 5 sets forth a single transistor DRAM cell 300 that includes a cell capacitor 302. The cell capacitor includes a first capacitor plate 304 and a second capacitor plate 306. Both capacitor plates (304 and 306) are fabricated in a similar manner as the floating gate described in the above EPROM cell.

Intermediate the capacitor plates (304 and 306) is a capacitor dielectric 308. The alternate embodiment uses a layer of silicon nitride 310. One skilled in the art would recognize that the nitride is deposited over the first capacitor plate 304 prior to the deposition and patterning steps that create the second capacitor plate 306. Further reference to FIG. 5 illustrates a first silicon dioxide layer 312 and a second silicon dioxide layer 314. As is well known in the art these layers are very thin when initially formed but can grow during subsequent fabrication steps. Unlike the prior art, the nitrogen doped α-Si oxidizes at a much slower rate than polysilicon or undoped α-Si. Accordingly, the silicon dioxide layers (312 and 314) of the capacitor dielectric 308 are much thinner than those of the prior art. This results in greater capacitance in the DRAM cell 300. As will be recalled from above, the oxide formed possesses less inherent stress, and so has fewer defects. It is noted that the microcrystalline structure of the nitrogen doped α-Si creates additional capacitor area, and if the capacitor plates (304 or 306) are doped, results in less oxide valleys as described in the prior art, increasing the reliability of the silicon oxide layer.

As will be apparent to one skilled in the art, the invention has been described in connection with its preferred embodiments, and may be changed, and other embodiments derived, without departing from the spirit and scope of the invention.

What I claim is:

1. A monolithic semiconductor device having a floating gate that uses electron tunneling to transfer electrons from the floating gate through a tunnel dielectric to an erase electrode, comprising:

a control gate;

an erase electrode;

a floating gate formed of nitrogen doped amorphous silicon;

a tunnel dielectric intermediate said erase electrode and said floating gate; and an intergate dielectric intermediate said control gate and said floating gate.

2. The semiconductor device of claim 1 wherein:

the nitrogen doped amorphous silicon is in-situ nitrogen doped amorphous silicon.

3. The semiconductor device of claim 1 wherein:

said floating gate is doped with an N-type dopant.

4. The semiconductor device of claim 1 wherein:

said floating gate is doped with a P-type dopant.

5. The semiconductor device of claim 1 wherein:

the semiconductor device is a three gate EPROM cell; and said erase electrode is an erase gate formed from a deposited conductive layer.

6. The semiconductor device of claim 1 wherein:

said erase electrode includes at least one doped region in a substrate.

7. The semiconductor device of claim 6 wherein:

said control gate, said floating gate, said intergate dielectric, and said erase electrode are pans of a single memory cell.

8. The semiconductor device of claim 7 wherein:

the said single memory cell is of stacked gate design, said floating gate being disposed over the substrate with said tunnel dielectric therebetween, the control gate being disposed over the floating gate with the intergate dielectric therebetween, and the erase electrode is a source region in the substrate.

9. The semiconductor device of claim 1 wherein:

at least a portion of the total thickness of the intergate dielectric is silicon dioxide thermally grown on said floating gate.

10. In a semiconductor integrated circuit, a capacitor for storing charge comprising:

a first electrode formed of a layer of nitrogen doped amorphous silicon;

a second electrode; and a capacitor dielectric including at least one layer of silicon dioxide formed by the oxidation of the first electrode.

11. The capacitor of claim 10 wherein:

said second electrode is formed of a layer of deposited nitrogen doped amorphous silicon.

12. The capacitor of claim 10 wherein:

said capacitor dielectric includes a second layer of deposited silicon nitride.

13. The capacitor of claim 12 wherein:

said capacitor dielectric includes a third layer of silicon dioxide formed by the oxidation of the second dielectric layer.

\* \* \* \* \*

UNITED STATES PATENT AND TRADEMARK OFFICE
CERTIFICATE OF CORRECTION

PATENT NO. : 5,557,122
DATED : September 17, 1996
INVENTOR(S) : Ritu Shrivastava and Chitranjan N. Reddy It is certified that error appears in the above-indentified patent and that said Letters Patent is hereby corrected as shown below:

On the title page,
Column 1, line 6, after "Assignee: Alliance" please delete [Semiconductors] and substitute -- Semiconductor --.

Signed and Sealed this

Thirteenth Day of May, 1997

Attest:

BRUCE LEHMAN

Attesting Officer

Commissioner of Patents and Trademarks